United States Patent
Vandemeer et al.

(10) Patent No.: US 10,138,119 B2
(45) Date of Patent: Nov. 27, 2018

(54) WAFER-LEVEL PACKAGE WITH ENHANCED PERFORMANCE

(71) Applicant: Qorvo US, Inc., Greensboro, NC (US)

(72) Inventors: Jan Edward Vandemeer, Kernersville, NC (US); Jonathan Hale Hammond, Oak Ridge, NC (US); Julio C. Costa, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/676,693

(22) Filed: Aug. 14, 2017

(65) Prior Publication Data

US 2018/0044177 A1 Feb. 15, 2018

Related U.S. Application Data

(60) Provisional application No. 62/374,447, filed on Aug. 12, 2016.

(51) Int. Cl.
*H01L 23/31* (2006.01)
*B81C 1/00* (2006.01)
(Continued)

(52) U.S. Cl.
CPC ........ *B81C 1/00801* (2013.01); *B81B 7/0025* (2013.01); *H01L 21/561* (2013.01);
(Continued)

(58) Field of Classification Search
CPC ..... H01L 23/28; H01L 23/3192; H01L 21/56; H01L 21/561; H10L 23/3135
See application file for complete search history.

(56) References Cited

U.S. PATENT DOCUMENTS

| 4,093,562 A | 6/1978 | Kishimoto |
| 4,366,202 A | 12/1982 | Borovsky |

(Continued)

FOREIGN PATENT DOCUMENTS

| CN | 103811474 A | 5/2014 |
| EP | 2996143 A1 | 3/2016 |

(Continued)

OTHER PUBLICATIONS

Notice of Allowance for U.S. Appl. No. 15/287,273, dated Jun. 30, 2017, 8 pages.

(Continued)

*Primary Examiner* — Earl N Taylor
(74) *Attorney, Agent, or Firm* — Withrow & Terranova, P.L.L.C.

(57) ABSTRACT

The present disclosure relates to a wafer-level package that includes a first thinned die, a multilayer redistribution structure, a first mold compound, and a second mold compound. The first thinned die includes a first device layer formed from glass materials. The multilayer redistribution structure includes redistribution interconnects that connect the first device layer to package contacts on a bottom surface of the multilayer redistribution structure. Herein, the connections between the redistribution interconnects and the first device layer are solder-free. The first mold compound resides over the multilayer redistribution structure and around the first thinned die, and extends beyond a top surface of the first thinned die to define an opening within the first mold compound and over the first thinned die. The second mold compound fills the opening and is in contact with the top surface of the first thinned die.

23 Claims, 8 Drawing Sheets

Figure 1:
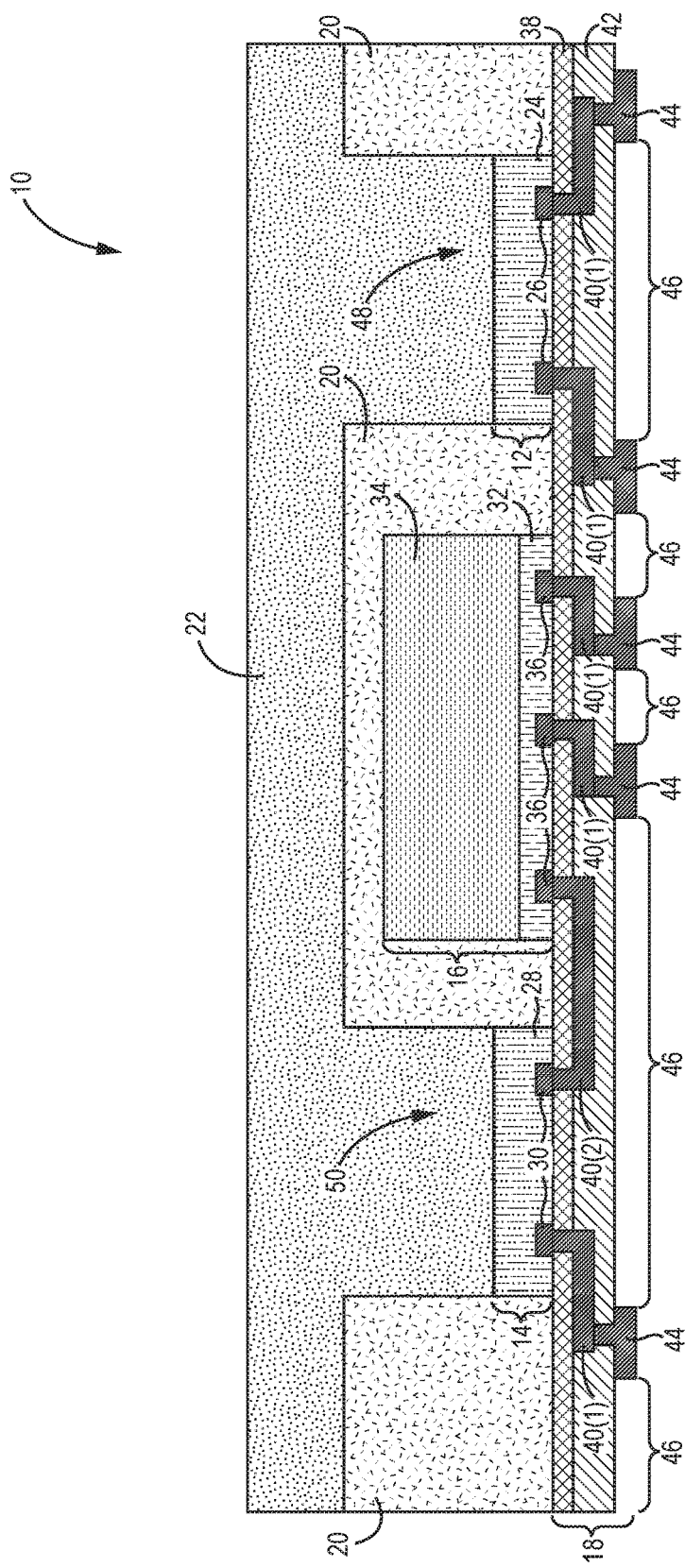

(51) Int. Cl.
  *B81B 7/00* (2006.01)
  *H01L 21/56* (2006.01)
  *H01L 23/00* (2006.01)
  *H01L 23/433* (2006.01)
  *H01L 23/538* (2006.01)

(52) U.S. Cl.
  CPC ........ *H01L 21/568* (2013.01); *H01L 23/3135* (2013.01); *H01L 23/3192* (2013.01); *H01L 24/19* (2013.01); *H01L 24/96* (2013.01); *B81B 2207/012* (2013.01); *B81B 2207/07* (2013.01); *B81B 2207/115* (2013.01); *B81C 2201/053* (2013.01); *B81C 2203/0792* (2013.01); *H01L 23/4334* (2013.01); *H01L 23/5389* (2013.01); *H01L 24/97* (2013.01); *H01L 2223/54486* (2013.01); *H01L 2224/04105* (2013.01); *H01L 2224/12105* (2013.01); *H01L 2224/24137* (2013.01); *H01L 2224/24195* (2013.01); *H01L 2924/1461* (2013.01); *H01L 2924/18162* (2013.01); *H01L 2924/19011* (2013.01); *H01L 2924/19041* (2013.01); *H01L 2924/19105* (2013.01)

(56) References Cited

U.S. PATENT DOCUMENTS

| | | | |
|---|---|---|---|
| 5,061,663 A | 10/1991 | Bolt et al. | |
| 5,069,626 A | 12/1991 | Patterson et al. | |
| 5,391,257 A | 2/1995 | Sullivan et al. | |
| 5,459,368 A | 10/1995 | Onishi et al. | |
| 5,646,432 A | 7/1997 | Iwaki et al. | |
| 5,648,013 A | 7/1997 | Uchida et al. | |
| 5,699,027 A | 12/1997 | Tsuji et al. | |
| 5,709,960 A | 1/1998 | Mays et al. | |
| 5,831,369 A | 11/1998 | Fürbacher et al. | |
| 5,920,142 A | 7/1999 | Onishi et al. | |
| 6,072,557 A | 6/2000 | Kishimoto | |
| 6,084,284 A | 7/2000 | Adamic, Jr. | |
| 6,154,366 A * | 11/2000 | Ma | H01L 23/5389 257/700 |
| 6,154,372 A | 11/2000 | Kalivas et al. | |
| 6,235,554 B1 | 5/2001 | Akram et al. | |
| 6,236,061 B1 | 5/2001 | Walpita | |
| 6,268,654 B1 | 7/2001 | Glenn et al. | |
| 6,271,469 B1 * | 8/2001 | Ma | H01L 21/56 174/521 |
| 6,423,570 B1 * | 7/2002 | Ma | H01L 21/561 257/612 |
| 6,426,559 B1 | 7/2002 | Bryan et al. | |
| 6,446,316 B1 | 9/2002 | Fürbacher et al. | |
| 6,578,458 B1 | 6/2003 | Akram et al. | |
| 6,649,012 B2 | 11/2003 | Masayuki et al. | |
| 6,713,859 B1 * | 3/2004 | Ma | H01L 21/561 257/687 |
| 6,841,413 B2 * | 1/2005 | Liu | H01L 21/4871 257/712 |
| 6,864,156 B1 | 3/2005 | Conn | |
| 6,902,950 B2 * | 6/2005 | Ma | H01L 21/561 257/737 |
| 6,943,429 B1 | 9/2005 | Glenn et al. | |
| 6,964,889 B2 * | 11/2005 | Ma | H01L 21/561 257/E23.135 |
| 6,992,400 B2 | 1/2006 | Tikka et al. | |
| 7,042,072 B1 | 5/2006 | Kim et al. | |
| 7,049,692 B2 | 5/2006 | Nishimura et al. | |
| 7,109,635 B1 | 9/2006 | McClure et al. | |
| 7,183,172 B2 | 2/2007 | Lee et al. | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,427,824 B2 | 9/2008 | Iwamoto et al. | |
| 7,596,849 B1 | 10/2009 | Carpenter et al. | |
| 7,619,347 B1 | 11/2009 | Bhattacharjee | |
| 7,635,636 B2 | 12/2009 | McClure et al. | |
| 7,714,535 B2 | 5/2010 | Yamazaki et al. | |
| 7,749,882 B2 * | 7/2010 | Kweon | H01L 21/4853 257/678 |
| 7,790,543 B2 | 9/2010 | Abadeer et al. | |
| 7,855,101 B2 | 12/2010 | Furman et al. | |
| 7,868,419 B1 | 1/2011 | Kerr et al. | |
| 7,960,218 B2 | 6/2011 | Ma et al. | |
| 8,183,151 B2 | 5/2012 | Lake | |
| 8,420,447 B2 | 4/2013 | Tay et al. | |
| 8,503,186 B2 | 8/2013 | Lin et al. | |
| 8,643,148 B2 | 2/2014 | Lin et al. | |
| 8,658,475 B1 | 2/2014 | Kerr | |
| 8,664,044 B2 | 3/2014 | Jin et al. | |
| 8,772,853 B2 | 7/2014 | Hong et al. | |
| 8,791,532 B2 | 7/2014 | Graf et al. | |
| 8,802,495 B2 | 8/2014 | Kim et al. | |
| 8,816,407 B2 * | 8/2014 | Kim | H01L 23/481 257/260 |
| 8,835,978 B2 | 9/2014 | Mauder et al. | |
| 8,906,755 B1 | 12/2014 | Hekmatshoartabari et al. | |
| 8,921,990 B2 | 12/2014 | Park et al. | |
| 8,927,968 B2 | 1/2015 | Cohen et al. | |
| 8,941,248 B2 | 1/2015 | Lin et al. | |
| 8,963,321 B2 | 2/2015 | Lenniger et al. | |
| 9,165,793 B1 | 10/2015 | Wang et al. | |
| 9,214,337 B2 | 12/2015 | Carroll et al. | |
| 9,368,429 B2 | 6/2016 | Ma et al. | |
| 9,461,001 B1 | 10/2016 | Tsai et al. | |
| 9,530,709 B2 | 12/2016 | Leipold et al. | |
| 9,613,831 B2 | 4/2017 | Morris et al. | |
| 9,646,856 B2 * | 5/2017 | Meyer | H01L 23/3107 |
| 9,859,254 B1 | 1/2018 | Yu et al. | |
| 9,941,245 B2 * | 4/2018 | Skeete | H01L 25/0652 |
| 2001/0004131 A1 | 6/2001 | Masayuki et al. | |
| 2002/0070443 A1 * | 6/2002 | Mu | H01L 21/561 257/712 |
| 2002/0074641 A1 * | 6/2002 | Towle | H01L 21/568 257/692 |
| 2002/0127769 A1 * | 9/2002 | Ma | H01L 21/561 438/106 |
| 2002/0127780 A1 * | 9/2002 | Ma | H01L 21/561 438/127 |
| 2002/0137263 A1 * | 9/2002 | Towle | H01L 21/56 438/127 |
| 2002/0185675 A1 | 12/2002 | Furukawa | |
| 2003/0207515 A1 | 11/2003 | Tan et al. | |
| 2004/0164367 A1 | 8/2004 | Park | |
| 2004/0166642 A1 | 8/2004 | Chen et al. | |
| 2004/0219765 A1 | 11/2004 | Reif et al. | |
| 2005/0037595 A1 | 2/2005 | Nakahata | |
| 2005/0079686 A1 | 4/2005 | Aigner et al. | |
| 2005/0212419 A1 | 9/2005 | Vazan et al. | |
| 2006/0057782 A1 * | 3/2006 | Gardes | H01L 21/6835 438/125 |
| 2006/0105496 A1 | 5/2006 | Chen et al. | |
| 2006/0108585 A1 | 5/2006 | Gan et al. | |
| 2006/0261446 A1 | 11/2006 | Wood et al. | |
| 2007/0020807 A1 | 1/2007 | Geefay et al. | |
| 2007/0069393 A1 | 3/2007 | Asahi et al. | |
| 2007/0075317 A1 | 4/2007 | Kato et al. | |
| 2007/0121326 A1 | 5/2007 | Nall et al. | |
| 2007/0158746 A1 | 7/2007 | Ohguro | |
| 2007/0181992 A1 * | 8/2007 | Lake | H01L 21/563 257/698 |
| 2007/0190747 A1 | 8/2007 | Humpston et al. | |
| 2007/0252481 A1 | 11/2007 | Iwamoto et al. | |
| 2007/0276092 A1 | 11/2007 | Kanae et al. | |
| 2008/0050852 A1 | 2/2008 | Hwang et al. | |
| 2008/0050901 A1 * | 2/2008 | Kweon | H01L 21/4853 438/597 |
| 2008/0164528 A1 | 7/2008 | Cohen et al. | |
| 2008/0272497 A1 | 11/2008 | Lake | |
| 2008/0315372 A1 | 12/2008 | Kuan et al. | |
| 2009/0008714 A1 | 1/2009 | Chae | |
| 2009/0010056 A1 | 1/2009 | Kuo et al. | |
| 2009/0014856 A1 | 1/2009 | Knickerbocker | |

(56) References Cited

U.S. PATENT DOCUMENTS

| | | |
|---|---|---|
| 2009/0179266 A1 | 7/2009 | Abadeer et al. |
| 2009/0261460 A1 | 10/2009 | Kuan et al. |
| 2010/0012354 A1 | 1/2010 | Hedin et al. |
| 2010/0029045 A1* | 2/2010 | Ramanathan ......... H01L 21/565 438/114 |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1* | 3/2011 | Lin ...................... H01L 23/3128 257/531 |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1* | 11/2011 | Chino ................... H01L 21/561 257/737 |
| 2011/0272824 A1* | 11/2011 | Pagaila ................. H01L 21/565 257/777 |
| 2011/0294244 A1 | 12/2011 | Hattori et al. |
| 2012/0003813 A1 | 1/2012 | Chuang et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1* | 2/2013 | Meyer ................. H01L 23/3107 257/773 |
| 2013/0099315 A1 | 4/2013 | Zhu et al. |
| 2013/0105966 A1* | 5/2013 | Kelkar .................... H01L 24/19 257/737 |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2015/0115416 A1 | 4/2015 | Costa et al. |
| 2015/0130045 A1 | 5/2015 | Tseng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1* | 9/2015 | Meyer ................. H01L 23/3107 257/737 |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1* | 3/2016 | Scanlan .................. H01L 23/48 257/737 |
| 2016/0100489 A1* | 4/2016 | Costa ...................... H01F 27/24 361/764 |
| 2016/0126111 A1 | 5/2016 | Leipold et al. |
| 2016/0126196 A1 | 5/2016 | Leipold et al. |
| 2016/0155706 A1 | 6/2016 | Yoneyama et al. |
| 2016/0284568 A1* | 9/2016 | Morris ................ H01L 23/3135 |
| 2016/0284570 A1* | 9/2016 | Morris ................ H01L 23/3135 |
| 2016/0343592 A1 | 11/2016 | Costa et al. |
| 2016/0343604 A1 | 11/2016 | Costa et al. |
| 2017/0032957 A1 | 2/2017 | Costa et al. |
| 2017/0077028 A1 | 3/2017 | Maxim et al. |
| 2017/0098587 A1 | 4/2017 | Leipold et al. |
| 2017/0190572 A1* | 7/2017 | Pan ....................... B81C 1/0023 |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1* | 11/2017 | Costa .................... B81C 1/0069 |
| 2017/0358511 A1* | 12/2017 | Costa .................. H01L 23/3135 |
| 2018/0019184 A1 | 1/2018 | Costa et al. |
| 2018/0019185 A1 | 1/2018 | Costa et al. |
| 2018/0044169 A1* | 2/2018 | Hatcher, Jr. ............. B81B 7/007 |
| 2018/0044177 A1* | 2/2018 | Vandemeer .......... B81C 1/00801 |
| 2018/0047653 A1* | 2/2018 | Costa .................. H01L 23/3192 |

FOREIGN PATENT DOCUMENTS

| | | |
|---|---|---|
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| WO | 2007074651 A1 | 7/2007 |

OTHER PUBLICATIONS

Corrected Notice of Allowability for U.S. Appl. No. 15/287,273, dated Jul. 21, 2017, 5 pages.

Supplemental Notice of Allowability for U.S. Appl. No. 15/287,273, dated Sep. 7, 2017, 5 pages.

Extended European Search Report for European Patent Application No. 15184861.1, dated Jan. 25, 2016, 6 pages.

Office Action of the Intellectual Property Office for Taiwanese Patent Application No. 104130224, dated Jun. 15, 2016, 9 pages.

Non-Final Office Action for U.S. Appl. No. 14/885,202, dated Apr. 14, 2016, 5 pages.

Final Office Action for U.S. Appl. No. 14/885,202, dated Sep. 27, 2016, 7 pages.

Advisory Action for U.S. Appl. No. 14/885,202, dated Nov. 29, 2016, 3 pages.

Notice of Allowance for U.S. Appl. No. 14/885,202, dated Jan. 27, 2017, 7 pages.

Notice of Allowance for U.S. Appl. No. 14/885,202, dated Jul. 24, 2017, 8 pages.

Notice of Allowance for U.S. Appl. No. 14/885,243, dated Aug. 31, 2016, 8 pages.

Non-Final Office Action for U.S. Appl. No. 12/906,689, dated May 27, 2011, 13 pages.

Non-Final Office Action for U.S. Appl. No. 12/906,689, dated Nov. 4, 2011, 20 pages.

Search Report for Japanese Patent Application No. 2011-229152, created on Feb. 22, 2013, 58 pages.

Office Action for Japanese Patent Application No. 2011-229152, drafted May 10, 2013, 7 pages.

Final Rejection for Japanese Patent Application No. 2011-229152, drafted Oct. 25, 2013, 2 pages.

International Search Report and Written Opinion for PCT/US2016/045809, dated Oct. 7, 2016, 11 pages.

Non-Final Office Action for U.S. Appl. No. 15/652,867, dated Oct. 10, 2017, 5 pages.

(56) References Cited

OTHER PUBLICATIONS

Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud AL et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Non-Final Office Action for U.S. Appl. No. 15/795,915, dated Feb. 23, 2018, 6 pages.
Non-Final Office Action for U.S. Appl. No. 15/387,855, dated Jan. 16, 2018, 7 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Jan. 17, 2018, 5 pages.
Supplemental Notice of Allowability for U.S. Appl. No. 15/287,273, dated Feb. 23, 2018, 5 pages.
Notice of Allowance for U.S. Appl. No. 15/498,040, dated Feb. 20, 2018, 8 pages.
Non-Final Office Action for U.S. Appl. No. 15/676,415, dated Mar. 27, 2018, 14 pages.
Non-Final Office Action for U.S. Appl. No. 15/676,621, dated Mar. 26, 2018, 16 pages.
International Preliminary Report on Patentability for PCT/US2016/045809, dated Feb. 22, 2018, 8 pages.
U.S. Appl. No. 15/293,947, filed Oct. 14, 2016.
U.S. Appl. No. 14/715,830, filed May 19, 2015.
U.S. Appl. No. 14/851,652, filed Sep. 11, 2015.
U.S. Appl. No. 14/872,910, filed Oct. 1, 2015.
U.S. Appl. No. 14/885,202, filed Oct. 16, 2015.
U.S. Appl. No. 15/387,855, filed Dec. 22, 2016.
U.S. Appl. No. 15/173,037, filed Jun. 3, 2016.
U.S. Appl. No. 15/648,082, filed Jul. 12, 2017.
U.S. Appl. No. 15/229,780, filed Aug. 5, 2016.
U.S. Appl. No. 15/262,457, filed Sep. 12, 2016.
U.S. Appl. No. 15/408,560, filed Jan. 18, 2017.
U.S. Appl. No. 15/287,202, filed Oct. 6, 2016.
U.S. Appl. No. 15/601,858, filed May 22, 2017.
U.S. Appl. No. 15/353,346, filed Nov. 16, 2016.
U.S. Appl. No. 15/652,826, filed Jul. 18, 2017.
U.S. Appl. No. 15/287,273, filed Oct. 6, 2016.
U.S. Appl. No. 15/676,415, filed Aug. 14, 2017.
U.S. Appl. No. 15/676,621, filed Aug. 14, 2017.
U.S. Appl. No. 15/498,040, filed Apr. 26, 2017.
U.S. Appl. No. 15/652,867, filed Jul. 18, 2017.
U.S. Appl. No. 15/789,107, filed Oct. 20, 2017.
U.S. Appl. No. 15/491,064, filed Apr. 19, 2017.
U.S. Appl. No. 15/695,579, filed Sep. 5, 2017.
U.S. Appl. No. 15/695,629, filed Sep. 5, 2017.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheetaspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 1, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.

(56) References Cited

OTHER PUBLICATIONS

Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q. et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.

(56) References Cited

OTHER PUBLICATIONS

Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Final Office Action for U.S. Appl. No. 15/616,109, dated Apr. 19, 2018, 18 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Notice of Allowance for U.S. Appl. No. 15/789,107, dated May 18, 2018, 8 pages.
Notice of Allowance for U.S. Appl. No. 15/695,629, dated Jul. 11, 2018, 12 pages.
Notice of Allowance for U.S. Appl. No. 15/387,855, dated Aug. 10, 2018, 7 pages.
Notice of Allowance and Applicant-Initiated Interview Summary for U.S. Appl. No. 15/262,457, dated Sep. 28, 2018, 16 pages.
Notice of Allowance for U.S. Appl. No. 15/914,538, dated Aug. 1, 2018, 9 pages.

* cited by examiner

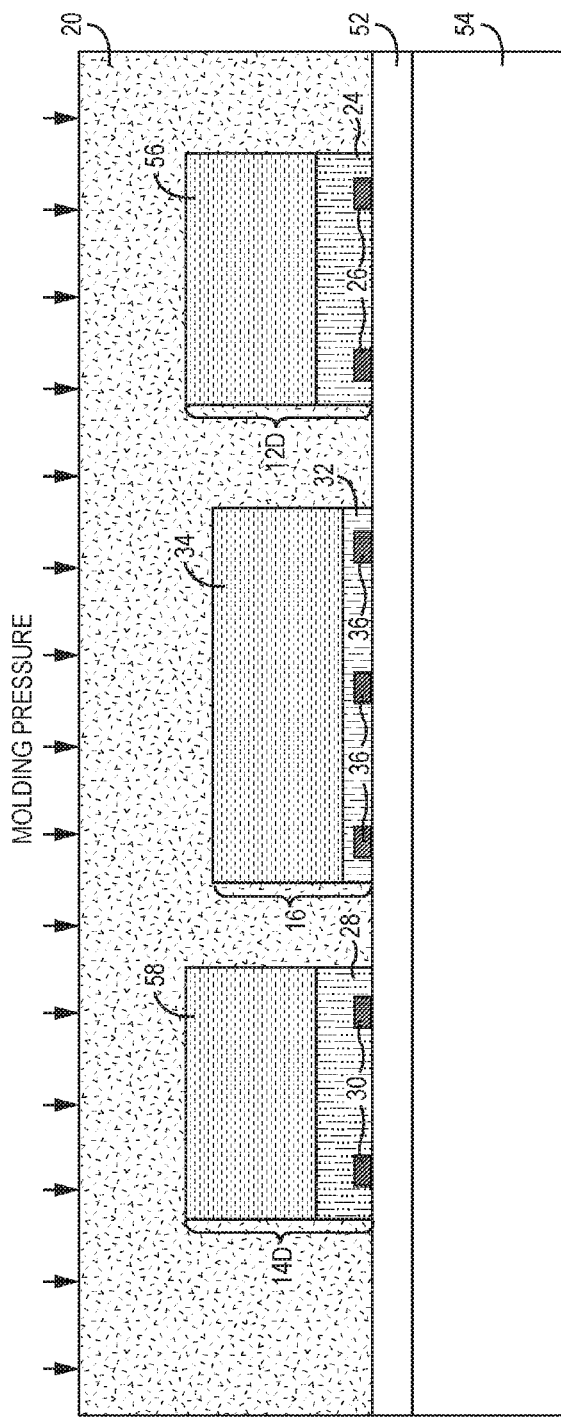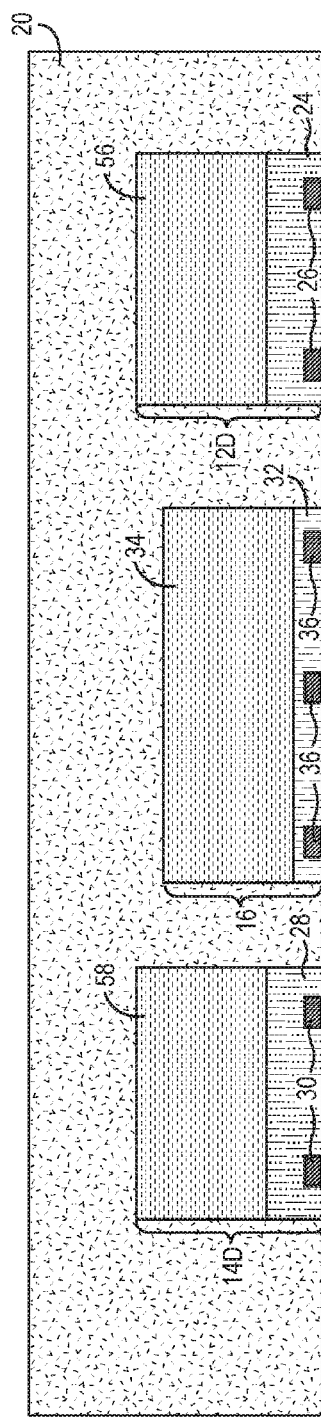
FIG. 4
FIG. 5

WAFER-LEVEL PACKAGE WITH ENHANCED PERFORMANCE

RELATED APPLICATIONS

This application claims the benefit of provisional patent application Ser. No. 62/374,447, filed Aug. 12, 2016, the disclosure of which is hereby incorporated herein by reference in its entirety.

FIELD OF THE DISCLOSURE

The present disclosure relates to a wafer-level package and a process for making the same, and more particularly to a wafer-level package with enhanced electrical and rigidity performance, and a packaging process to enhance electrical and rigidity performance of a wafer-level package.

BACKGROUND

The wide utilization of cellular and wireless devices drives the rapid development of radio frequency (RF) technologies. The substrates on which RF devices are fabricated play an important role in achieving high level performance in the RF technologies. Fabrications of the RF devices on conventional silicon substrates may benefit from low cost of silicon materials, a large scale capacity of wafer production, well-established semiconductor design tools, and well-established semiconductor manufacturing techniques.

Despite the benefits of using conventional silicon substrates for RF device fabrication, it is well known in the industry that the conventional silicon substrates may have two undesirable properties for the RF devices: harmonic distortion and low resistivity values. Harmonic distortion is a critical impediment to achieve high level linearity in the RF devices built over silicon substrates. In addition, the low resistivity encountered in the silicon substrates may degrade quality factors (Q) at high frequencies of microelectromechanical systems (MEMS) or other passive components.

Wafer-level fan-out (WLFO) packaging technology and embedded wafer-level ball grid array (EWLB) technology currently attract substantial attention in portable RF applications. WLFO and EWLB technologies are designed to provide high density input/output ports (I/O) as well as low profile package height without increasing the size of the component semiconductor chips. The I/O pad size on the chip remains small keeping die size to a minimum. This capability allows for densely packaging the RF devices within a single wafer.

To reduce deleterious harmonic distortion of the RF devices, and to utilize advantages of WLFO/EWLB packaging technologies, it is therefore an object of the present disclosure to provide an improved package design with enhanced performance. Further, there is also a need to enhance the performance of the RF devices without increasing the package size.

SUMMARY

The present disclosure relates to a wafer-level package with enhanced electrical and rigidity performance, and a packaging process for making the same. The disclosed wafer-level package includes a first thinned die, a multilayer redistribution structure, a first mold compound, and a second mold compound. The first thinned die includes a first device layer, which is formed from glass materials and has a number of first die contacts at a bottom surface of the first device layer. The multilayer redistribution structure includes a number of package contacts on a bottom surface of the multilayer redistribution structure and redistribution interconnects that connect the package contacts to certain ones of the first die contacts. Connections between the redistribution interconnects and the first die contacts are solder-free. In addition, the first mold compound resides over the multilayer redistribution structure and around the first thinned die, and extends beyond a top surface of the first thinned die to define an opening within the first mold compound and over the first thinned die. The top surface of the first thinned die is exposed at a bottom of the opening. The second mold compound fills the opening and is in contact with the top surface of the first thinned die.

In one embodiment of the wafer-level package, the glass materials are at least one of a group consisting of Silicon Dioxide ($SiO_2$), Aluminum Oxide ($Al_2O_3$), Lithium superoxide ($LiO_2$), Barium oxide (BaO), Potassium oxide ($K_2O$), Sodium Oxide ($Na_2O$), Boron Oxide (B2O3), Magnesium Oxide (MgO), Strontium Oxide (SrO), and Calcium Oxide (CaO).

In one embodiment of the wafer-level package, the first thinned die provides a microelectromechanical systems (MEMS) component.

According to another embodiment, the wafer-level package further includes a second intact die residing over the multilayer redistribution structure. Herein, the second intact die has a second device layer and an intact silicon substrate over the second device layer, and the first mold compound encapsulates the second intact die.

In one embodiment of the wafer-level package, the first thinned die provides a MEMS component and the second intact die provides a complementary metal-oxide-semiconductor (CMOS) controller that controls the MEMS component.

In one embodiment of the wafer-level package, the second device layer is formed from a combination of dielectric and metal layers.

In one embodiment of the wafer-level package, the second mold compound has an electrical resistivity greater that 1E6 Ohm-cm.

In one embodiment of the wafer-level package, the first mold compound is formed from a same material as the second mold compound.

In one embodiment of the wafer-level package, the first mold compound and the second mold compound are formed from different materials.

In one embodiment of the wafer-level package, the top surface of the first thinned die exposed at the bottom of the opening is a top surface of the first device layer.

In one embodiment of the wafer-level package, the second mold compound is formed from thermoplastics or thermoset materials with a thermal conductivity greater than 2 W/m·K. Herein, the first device layer has a thickness between 70 µm and 1000 µm.

In one embodiment of the wafer-level package, the second mold compound is formed from organic epoxy resin. Herein, the first device layer has a thickness between 5 µm and 1000 µm.

In one embodiment of the wafer-level package, the multilayer redistribution structure is glass-free.

According to an exemplary process, a mold wafer having a first die and a first mold compound is provided. The first die includes a first device layer and a first silicon substrate over the first device layer. The first device layer is formed from glass materials and includes a number of first die contacts at a bottom surface of the first device layer. A top surface of the first die is a top surface of the first silicon substrate and a bottom surface of the first die is the bottom surface of the first device layer. The first mold compound encapsulates sides and top of the first die such that the bottom surface of the first device layer is exposed. Next, a multilayer redistribution structure is formed underneath the mold wafer. The multilayer redistribution structure includes a number of package contacts on a bottom surface of the multilayer redistribution structure and redistribution interconnects that connect the package contacts to certain ones of the first die contacts. Connections between the redistribution interconnects and the first die contacts are solder-free. The first mold compound is then thinned down to expose the top surface of the first silicon substrate. The first silicon substrate of the first die is removed substantially to provide a first thinned die and form an opening within the first mold compound and over the first thinned die. A top surface of the first thinned die is exposed at a bottom of the opening. Lastly, a second mold compound is applied to substantially fill the opening and directly contact the top surface of the first thinned die.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 shows an exemplary wafer-level package according to one embodiment of the present disclosure.

FIGS. 2-13 provide exemplary steps that illustrate a process to fabricate the exemplary wafer-level package shown in FIG. 1.

It will be understood that for clarity of illustration, FIGS. 1-13 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a wafer-level package with enhanced electrical and rigidity performance, and a packaging process for making the same. FIG. 1 shows an exemplary wafer-level package 10 according to one embodiment of the present disclosure. For the purpose of this illustration, the exemplary wafer-level package 10 includes a thinned glass-based die 12, a thinned microelectromechanical systems (MEMS) die 14, a complementary metal-oxide-semiconductor (CMOS) controller die 16, a multilayer redistribution structure 18, a first mold compound 20, and a second mold compound 22. In different applications, the wafer-level package 10 may include fewer or more thinned glass-based/MEMS dies. For instance, in some applications, the wafer-level package 10 may only include thinned MEMS dies and CMOS controller dies; and in some applications, the wafer-level package 10 may only include thinned glass-based dies.

In detail, the thinned glass-based die 12 includes a first device layer 24, which is formed from glass materials, such as Silicon Dioxide ($SiO_2$), Aluminum Oxide ($Al_2O_3$), Lithium superoxide ($LiO_2$), Barium oxide (BaO), Potassium oxide (K$_2$O), Sodium Oxide (Na$_2$O), Boron Oxide (B2O3), Magnesium Oxide (MgO), Strontium Oxide (SrO), and Calcium Oxide (CaO). The glass materials used in the first device layer 24 may be alkali free. The first device layer 24 includes a number of first die contacts 26 and at least one electronic component (not shown) coupled to the first die contacts 26. Herein, the first die contacts 26 are at a bottom surface of the first device layer 24, while the at least one electronic component (not shown) is not exposed at a top surface of the first device layer 24. Since the first device layer 24 is formed from glass materials, which typically have low thermal tolerance, the at least one electronic component (not shown) in the first device layer 24 is a low heat-generation component, such as a low-power filter, a low-power capacitor, and etc. The first device layer 24 may have a thickness between 5 μm and 1000 μm, which may ensure at least 100 psi molding pressure, or between 70 μm and 1000 μm, which may ensure at least 750 psi molding pressure (more details are described in the following fabrication process). From size, cost, and rigidity aspects, the first device layer 24 may have a thickness between 70 μm and 200 μm.

The thinned MEMS die 14 includes a second device layer 28, which is also formed from glass materials, such as Silicon Dioxide (SiO$_2$), Aluminum Oxide (Al$_2$O$_3$), Lithium superoxide (LiO$_2$), Barium oxide (BaO), Potassium oxide (K$_2$O), Sodium Oxide (Na$_2$O), Boron Oxide (B2O3), Magnesium Oxide (MgO), Strontium Oxide (SrO), and Calcium Oxide (CaO). The glass materials used in the first device layer 24 may be alkali free. The second device layer 28 includes a number of second die contacts 30 and a MEMS component (not shown) coupled to the second die contacts 30. Herein, the second die contacts 30 are at a bottom surface of the second device layer 28, while the MEMS component is not exposed at a top surface of the second device layer 28. The MEMS component is typically a switch and has low heat-generation. The second device layer 28 may have a thickness between 5 μm and 1000 μm, which may ensure at least 100 psi molding pressure, or between 70 μm and 1000 μm, which may ensure at least 750 psi molding pressure (more details are described in the following fabrication process). From size, cost, and rigidity aspects, the second device layer 28 may have a thickness between 70 μm and 200 μm.

Notice that the thinned glass-based die 12 and the thinned MEMS die 14 are both thinned dies, which have a device layer and essentially no silicon substrate over the device layer. Herein, essentially no silicon substrate over the device layer refers to at most 2 μm silicon substrate over the device layer. In desired cases, each thinned die does not include any silicon substrate over the device layer such that a top surface of each thinned die is a top surface of the device layer. For other cases, the top surface of one thinned die may be a top surface of the thin silicon substrate.

The CMOS controller die 16 includes a third device layer 32 and a silicon substrate 34 over the third device layer 32. The third device layer 32 may include a CMOS controller (not shown) that controls the MEMS component (not shown) within the thinned MEMS die 14, and a number of third die contacts 36 that are coupled to the CMOS controller and at a bottom surface of the third device layer 32. The third device layer 32 has a thickness between 0.1 μm and 50 μm, and may be formed from a combination of dielectric and metal layers (such as silicon oxide, silicon nitride, aluminum, titanium, copper, or the like). The CMOS controller die 16 is an intact die, which includes the intact silicon substrate 34 with a thickness between 25 μm and 250 μm or between 10 μm and 750 μm.

Herein, the multilayer redistribution structure 18 includes a first dielectric pattern 38 at the top, a number of redistribution interconnects 40, a second dielectric pattern 42, and a number of package contacts 44. In one embodiment, the thinned glass-based die 12, the thinned MEMS die 14, and the CMOS controller die 16 reside directly over the multilayer redistribution structure 18. As such, the first device layer 24 of the thinned glass-based die 12, the second device layer 28 of the thinned MEMS die 14, and the third device layer 32 of the CMOS controller die 16 are in contact with the first dielectric pattern 38. In addition, the first die contacts 26 at the bottom surface of the first device layer 24, the second die contacts 30 at the bottom surface of the second device layer 28, and the third die contacts 36 at the bottom surface of the third device layer 32 are exposed through the first dielectric pattern 38.

For the purpose of this illustration, the redistribution interconnects 40 include five first redistribution interconnects 40(1) and one second redistribution interconnect 40(2). In different applications, the redistribution interconnects 40 may include fewer or more first redistribution interconnects 40(1)/second redistribution interconnects 40(2). Each first redistribution interconnect 40(1) connects one package contact 44 to a corresponding one of the first, second, and third die contacts 26, 30, and 36. The second redistribution interconnect 40(2) is used to connect one second die contact 30 to a corresponding third die contact 36, such that the CMOS controller (not shown) within the CMOS controller die 16 electrically connects the MEMS component (not shown) within the thinned MEMS die 14. Herein, each redistribution interconnect 40 is electrically coupled to at least one of the first, second, and third die contacts 26, 30, and 36 through the first dielectric pattern 38 and extends underneath the first dielectric pattern 38. The connections between the redistribution interconnects 40 and the first, second, and third die contacts 26, 30, and 36 are solder-free.

The second dielectric pattern 42 is formed underneath the first dielectric pattern 38. The second dielectric pattern 42 partially encapsulates each first redistribution interconnect 40(1). As such, a portion of each first redistribution interconnect 40(1) is exposed through the second dielectric pattern 42. Further, the second dielectric pattern 42 fully encapsulates the second redistribution interconnect 40(2). As such, no portion of the second redistribution interconnect 40(2) is exposed through the second dielectric pattern 42. In different applications, there may be extra redistribution interconnects (not shown) electrically coupled to the redistribution interconnects 40 through the second dielectric pattern 42, and an extra dielectric pattern (not shown) formed underneath the second dielectric pattern 42 to partially encapsulate each of the extra redistribution interconnects.

In this embodiment, each package contact 44 is on a bottom surface of the multilayer redistribution structure 18 and electrically coupled to a corresponding first redistribution interconnect 40(1) through the second dielectric pattern 42. Consequently, the first redistribution interconnects 40(1) connect the package contacts 40 to certain ones of the first, second, and third die contacts 26, 30, and 36. Herein, the package contacts 44 are separate from each other and extend underneath the second dielectric pattern 42, such that an air gap 46 is formed surrounding each package contact 44. The air gap 46 may extend underneath the thinned glass-based die 12 and/or underneath the thinned MEMS die 14.

Further, the multilayer redistribution structure 18 may be free of glass fiber or glass-free. Herein, the glass fiber refers to individual glass strands twisted to become a larger grouping. These glass strands may then be woven into a fabric. The first dielectric pattern 38 and the second dielectric pattern 42 may be formed of Benzocyclobutene (BCB) or polyimide. The redistribution interconnects 40 may be formed of copper or other suitable metals. The package contacts 44 may be formed of at least one of copper, gold, nickel, and palladium. The multilayer redistribution structure 18 has a thickness between 2 µm and 300 µm.

The first mold compound 20 resides over a top surface of the multilayer redistribution structure 18, resides around the thinned glass-based die 12 and the thinned MEMS die 14, and encapsulates the CMOS controller die 16. Further, the first mold compound 20 extends beyond a top surface of the thinned glass-based die 12 to define a first opening 48 within the first mold compound 20 and over the thinned glass-based die 12, and extends beyond a top surface of the thinned MEMS die 14 to define a second opening 50 within the first mold compound 20 and over the thinned MEMS die 14. Herein, the top surface of the thinned glass-based die 12 is exposed at a bottom of the first opening 48, and the top surface of the thinned MEMS die 14 is exposed at a bottom of the second opening 50.

The second mold compound 22 substantially fills the first and second openings 48 and 50, and is in contact with the top surface of the thinned glass-based die 12 and the top surface of the thinned MEMS die 14. The second mold compound 22 may have an electrical resistivity greater than 1E6 Ohm-cm. The high electrical resistivity of the second mold compound 22 may improve the quality factor (Q) at high frequencies of the MEMS component (not shown) of the thinned MEMS die 14.

The second mold compound 22 may be formed of thermoplastics or thermoset materials with a thermal conductivity greater than 2 W/m·K, such as PPS (poly phenyl sulfide), overmold epoxies doped with boron nitride or alumina thermal additives, or the like. The second mold compound 22 may also be formed from an organic epoxy resin system with a thermal conductivity less than 2 W/m·K. The second mold compound 22 may be formed of a same or different material as the first mold compound 20. However, unlike the second mold compound 22, the first mold compound 20 does not have electrical resistivity requirements. Herein, a portion of the second mold compound 22 may reside over a top surface of the first mold compound 20. Notice that the second mold compound 22 is separate from the CMOS controller die 16 by the first mold compound 20. A top surface of the CMOS controller die 16 is in contact with the first mold compound 20.

FIGS. 2-13 provide exemplary steps to fabricate the exemplary wafer-level package 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 2-13.

Figure 2:
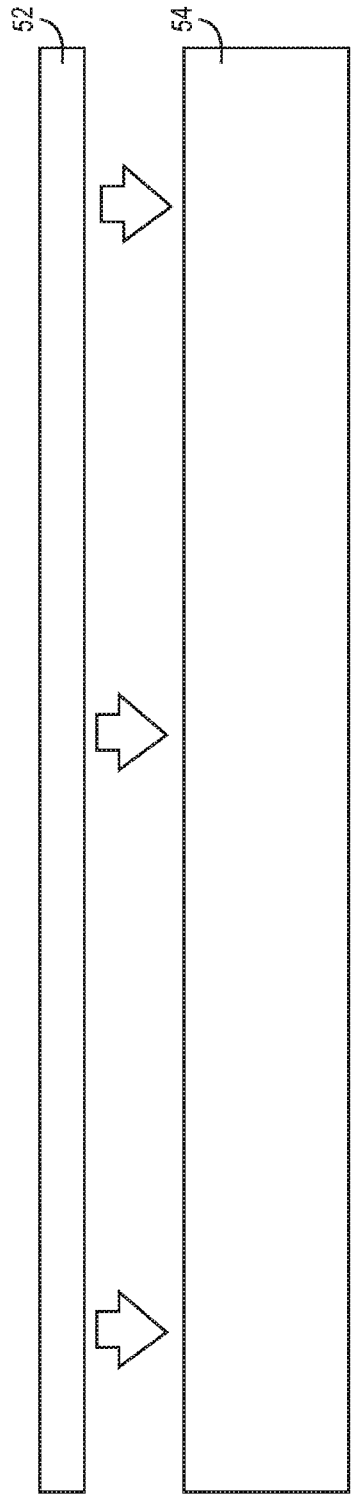
Figure 3:
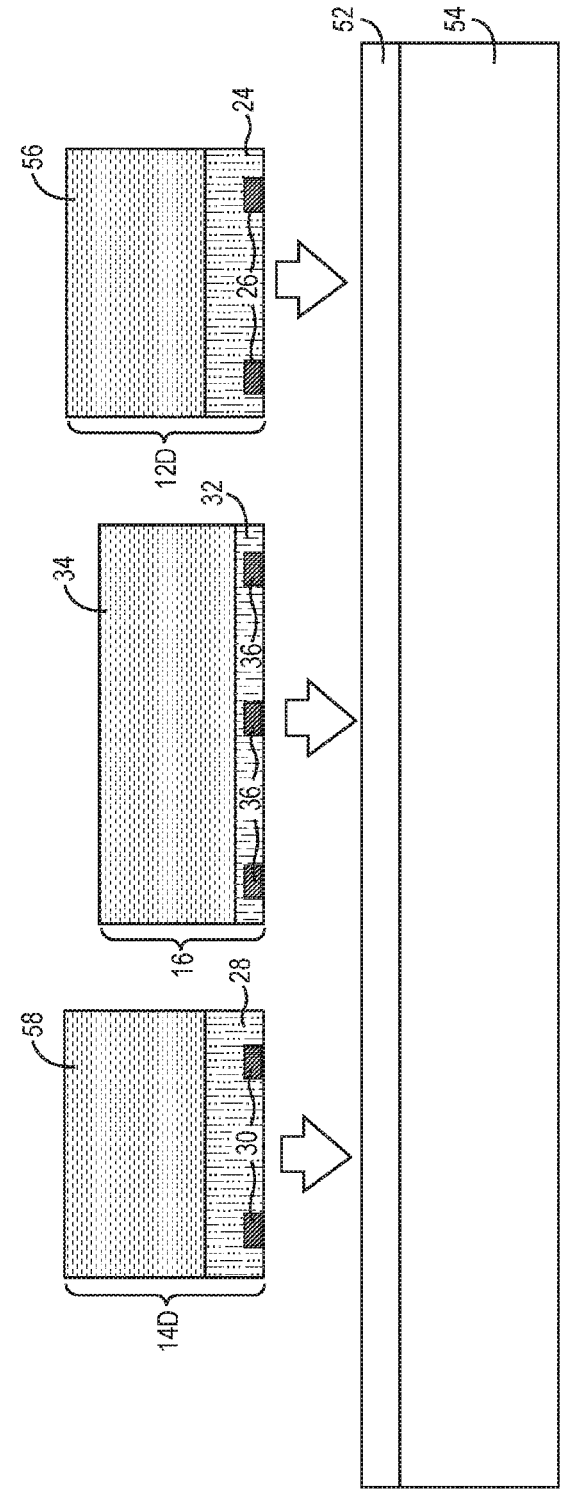

Initially, an adhesive layer 52 is applied on a top surface of a carrier 54 as illustrated in FIG. 2. Then, a glass-based die 12D, a MEMS die 14D, and the CMOS controller die 16 are attached to the adhesive layer 52 as illustrated in FIG. 3. In different applications, there might be fewer or more dies attached to the adhesive layer 52. For instance, in some applications, there may be only the glass-based die 12D attached to the adhesive layer 52; and in some applications, there may be only the MEMS die 14D and the CMOS controller die 16 attached to the adhesive layer 52.

The glass-based die 12D includes the first device layer 24 and a first silicon substrate 56 over the first device layer 24. As such, the bottom surface of the first device layer 24 is a bottom surface of the glass-based die 12D, and the backside of the first silicon substrate 56 is a top surface of the glass-based die 12D. The first silicon substrate 56 has a thickness between 5 µm and 750 µm. The glass-based die 12D has a thickness between 75 µm and 250 µm, or between 10 µm and 1750 µm.

The MEMS die 14D includes the second device layer 28 and a second silicon substrate 58 over the second device layer 28. As such, the bottom surface of the second device layer 28 is a bottom surface of the MEMS die 14D, and the backside of the second silicon substrate 58 is a top surface of the MEMS die 14D. The second silicon substrate 58 has a thickness between 5 µm and 750 µm. The MEMS die 14D has a thickness between 75 µm and 250 µm, or between 10 µm and 1750 µm. In this embodiment, the CMOS controller die 16 may be shorter than the glass-based die 12D and the MEMS die 14D. In different applications, the CMOS controller die 18 may be the same height as the glass-based die 12D and the MEMS die 14D, or the CMOS controller die 18 may be taller than the glass-based die 12D and the MEMS die 14D.

Next, the first mold compound 20 is applied over the adhesive layer 52 to encapsulate the glass-based die 12D, the MEMS die 14D, and the CMOS controller die 16 as illustrated in FIG. 4. The first mold compound 20 may be applied by various procedures, such as sheet molding, overmolding, compression molding, transfer molding, dam fill encapsulation, or screen print encapsulation. In a typical compression molding, a molding pressure used for applying the first mold compound 20 is between 100 psi and 1000 psi. Since the glass-based die 12D, the MEMS die 14D, and the CMOS controller die 16 are relatively thick and the bottom surfaces of the glass-based die 12D, the MEMS die 14D, and the CMOS controller die 16 are essentially flat, there may be no vertical deformations occurring to the glass-based die 12D, the MEMS die 14D, or the CMOS controller die 16 during this molding step.

The first mold compound 20 may be an organic epoxy resin system or the like, which can be used as an etchant barrier to protect the glass-based die 12D, the MEMS die 14D, and the CMOS controller die 16 against etching chemistries such as potassium hydroxide (KOH), sodium hydroxide (NaOH), and acetylcholine (ACH). A curing process (not shown) is then used to harden the first mold compound 20. The curing temperature is between 100° C. and 320° C. depending on which material is used as the first mold compound 20. The adhesive layer 52 and the carrier 54 are then removed to expose the bottom surface of the first device layer 24, the bottom surface of the second device layer 28, and the bottom surface of the third device layer 32 as shown in FIG. 5. Removal of the adhesive layer 52 and the carrier 54 may be provided by heating the adhesive layer 52.

Figure 6:
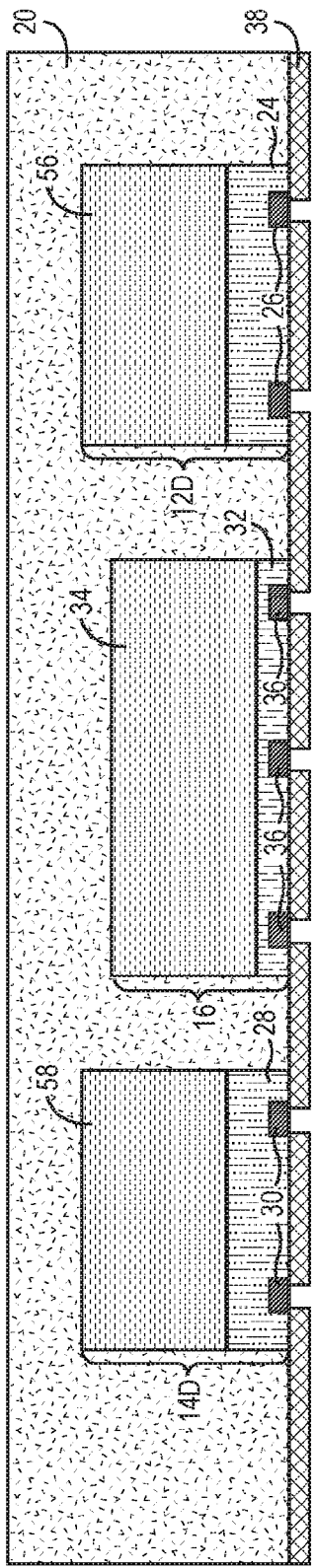

With reference to FIGS. 6 through 9, the multilayer redistribution structure 18 is formed according to one embodiment of the present disclosure. The first dielectric pattern 38 is firstly formed underneath the glass-based die 12D, the MEMS die 14D, and the CMOS controller die 16, as illustrated in FIG. 6. As such, the first, second, and third die contacts 26, 30, and 36 are exposed through the first dielectric pattern 38.

Figure 7:
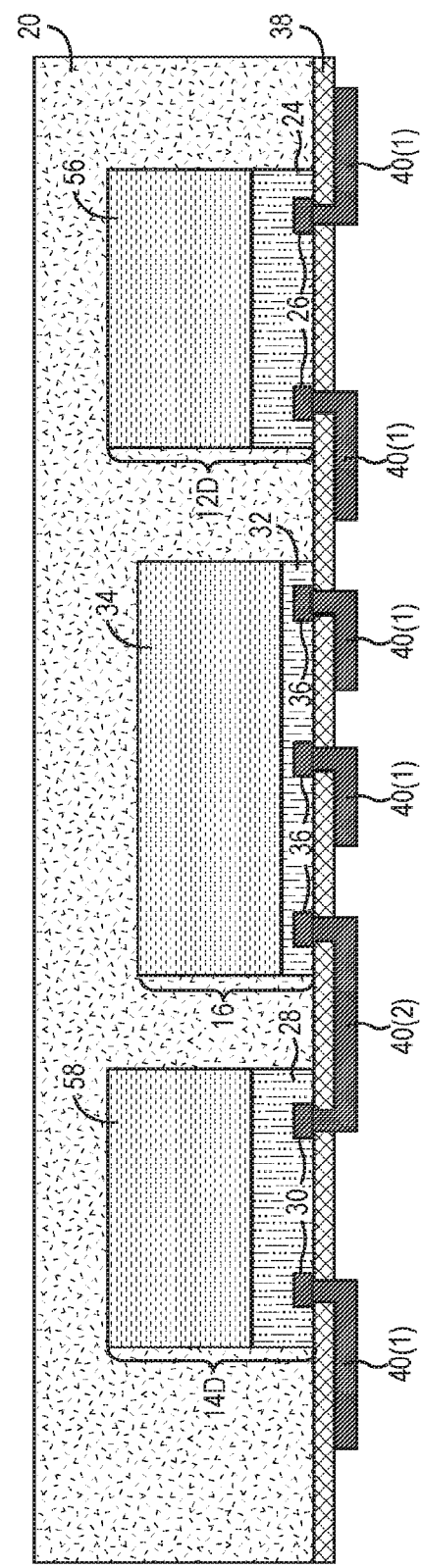

Next, the redistribution interconnects 40 are formed as illustrated in FIG. 7. Herein, the redistribution interconnects 40 includes five first redistribution interconnects 40(1) and one second redistribution interconnect 40(2). In different applications, the redistribution interconnects 40 may include fewer or more first redistribution interconnects 40(1)/second redistribution interconnects 40(2). The first redistribution interconnects 40(1) are electrically coupled to the first, second, and third die contacts 26, 30, and 36 through the first dielectric pattern 38 and extend underneath the first dielectric pattern 38. The second redistribution interconnect 40(2) is used to connect one second die contact 30 to a corresponding third die contact 36, such that the CMOS controller (not shown) within the CMOS controller die 16 electrically connects the MEMS component (not shown) within the thinned MEMS die 14. The second redistribution interconnect 40(2) may also extend underneath the first dielectric pattern 38. The connections between the redistribution interconnects 40 and the first, second, and third die contacts 26, 30, and 36 are solder-free.

Figure 8:
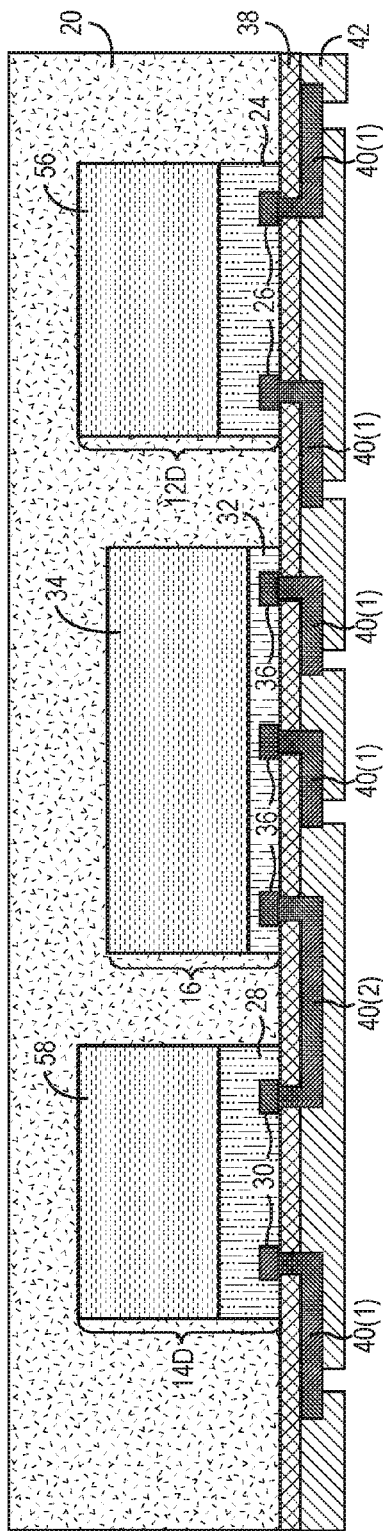
Figure 9:
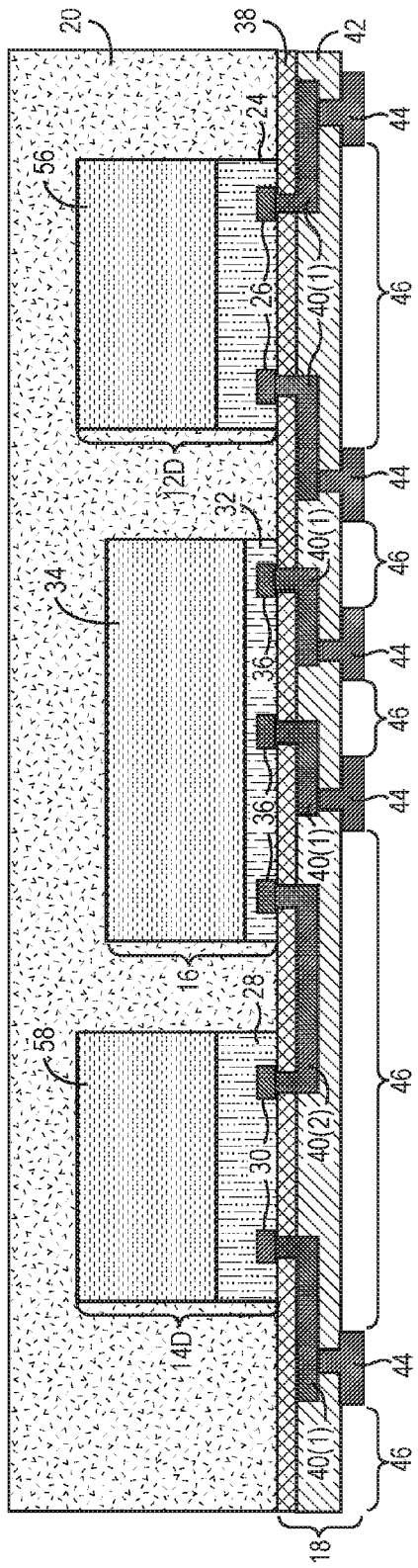

The second dielectric pattern 42 is formed underneath the first dielectric pattern 38 to partially encapsulate each first redistribution interconnect 40(1) as illustrated in FIG. 8. As such, a portion of each first redistribution interconnect 40(1) is exposed through the second dielectric pattern 42. Further, the second dielectric pattern 42 fully encapsulates the second redistribution interconnect 40(2). As such, no portion of the second redistribution interconnect 40(2) is exposed through the second dielectric pattern 42. Lastly, the package contacts 44 and the air gap 46 are formed as illustrated in FIG. 9. Each package contact 44 is coupled to an exposed portion of a corresponding first redistribution interconnect 40(1) through the second dielectric pattern 42. Consequently, the first redistribution interconnects 40(1) connect the package contacts 44 to certain ones of the first, second, and third die contacts 26, 30, and 36. In addition, the package contacts 44 are separate from each other and extend underneath the second dielectric pattern 42, such that the air gap 46 is simultaneously formed surrounding each package contact 44.

Figure 10:
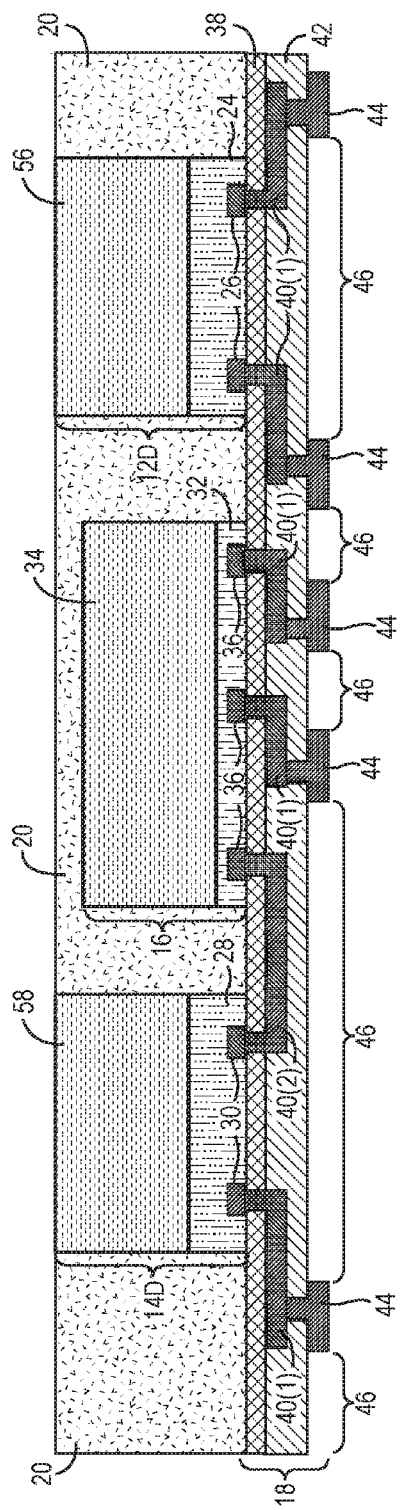

After the multilayer redistribution structure 18 is formed, the first mold compound 20 is thinned down to expose the first silicon substrate 56 of the glass-based die 12D and the second silicon substrate 58 of the MEMS die 14D as shown in FIG. 10. The thinning procedure may be done with a mechanical grinding process. Since the CMOS controller die 16 has a lower height than both the MEMS die 14D and the glass-based die 12D, the silicon substrate 34 of the CMOS controller die 16 is not exposed and still encapsulated by the first mold compound 20.

Figure 11:
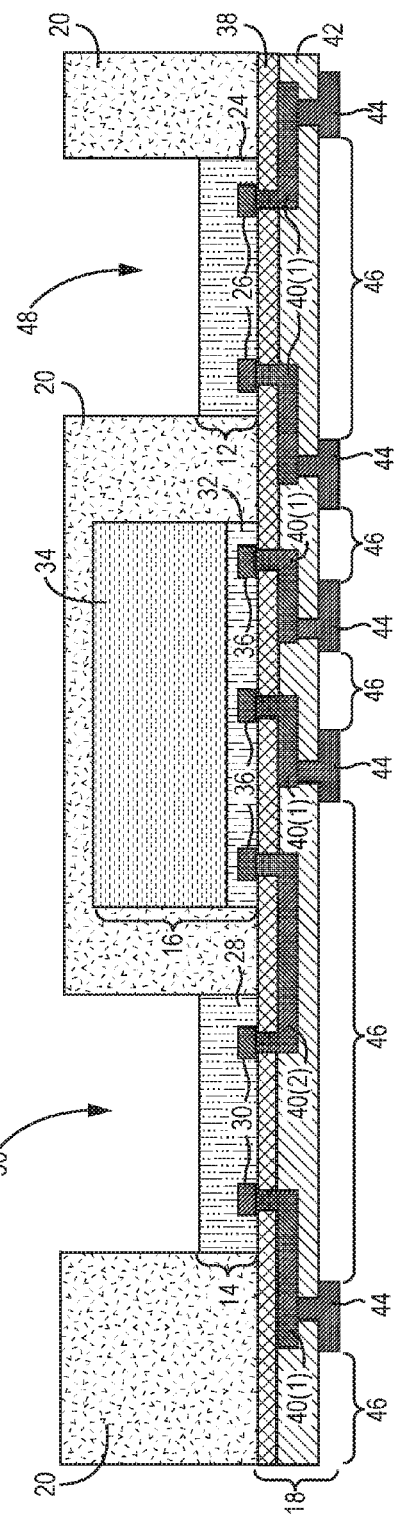

Next, the first silicon substrate 56 and the second silicon substrate 58 are removed substantially to provide a precursor package 60, as illustrated in FIG. 11. The removal of the first silicon substrate 56 from the glass-based die 12D provides the thinned glass-based die 12 and forms the first opening 48 within the first mold compound 20 and over the thinned glass-based die 12. The removal of the second silicon substrate 58 from the MEMS die 14D provides the thinned MEMS die 14 and forms the second opening 50 within the first mold compound 20 and over the thinned MEMS die 14. Herein, removing substantially a silicon substrate refers to removing at least 95% of the entire silicon substrate and leaving at most 2 μm silicon substrate. In desired cases, the first and second silicon substrates 56 and 58 are removed completely, such that the first device layer 24 of the thinned glass-based die 12 is exposed at the bottom of the first opening 48 and the second device layer 28 of the thinned MEMS die 14 is exposed at the bottom of the second opening 50.

Removing substantially the first and second silicon substrates 56 and 58 may be provided by an etching process with a wet/dry etchant chemistry, which may be TMAH, KOH, ACH, NaOH, or the like. Both the first device layer 24 and the second device layer 28 are formed from glass materials, which are resistant to these wet/dry etching chemistries, such that the electronic components (not shown) within the first device layer 24 and the MEMS component (not shown) within the second device layer 28 will not be damaged by these wet/dry etching chemistries. The first mold compound 20 encapsulates and protects the CMOS controller die 16 from the wet/dry etchant chemistries. In some applications, a protection layer (not shown) may be placed at the bottom surface of the multilayer redistribution structure 18 to protect the package contacts 44 from the etchant chemistry. The protection layer is applied before the etching process and removed after the etching process. Further, if the silicon substrate 34 of the CMOS controller die 16 is not encapsulated by the first mold compound 20 (in some applications, if the CMOS controller die 16 has a same height as or is taller than glass-based die 12 and the MEMS die 14, the silicon substrate 34 of the CMOS controller die 16 will be exposed during the thinning process), there may be an extra protection layer (not shown) placed over the silicon substrate 34 to protect the CMOS controller die 16 from the wet/dry etchant chemistry. The extra protection layer is applied before the etching process and removed after the etching process.

Figure 12:
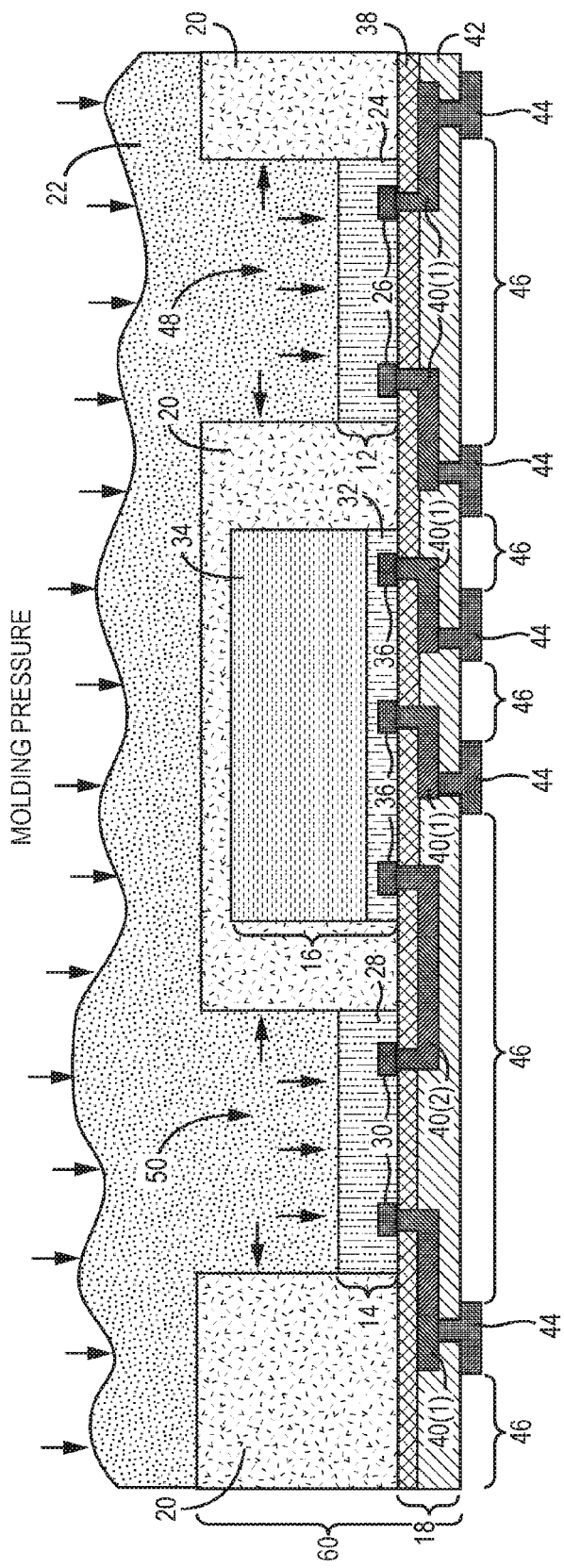

The second mold compound 22 is then applied to substantially fill the first and second openings 48 and 50, as illustrated in FIG. 12. Herein, substantially filling an opening refers to filling at least 75% of the entire opening. The second mold compound 22 directly resides over the top surface of the thinned glass-based die 12 and the top surface of the thinned MEMS die 14. If there is no first silicon substrate 56 left in the first opening 48 and no second silicon substrate 58 left in the second opening 50, the second mold compound 22 directly resides over the first device layer 24 and the second device layer 28. In addition, the second mold compound 22 may further reside over the first mold compound 20. In some applications, the precursor package 60 may be attached to a rigid carrier (not shown) before applying the second mold compound 22 to substantially fill the first and second openings 48 and 50. The rigid carrier (not shown) may help assist with mechanical support of the precursor package 60 and help prevent further deformation of the thinned glass-based die 12 and the thinned MEMS die 14.

The second mold compound 22 may be applied by various procedures, such as sheet molding, overmolding, compression molding, transfer molding, dam fill encapsulation, and screen print encapsulation. During the molding process of the second mold compound 22, liquefaction and molding pressure are not uniform across the entire precursor package 60. A first combination of the thinned glass-based die 12 and a first portion of the multilayer redistribution structure 18 directly underneath the thinned glass-based die 12, and a second combination of the thinned MEMS die 14 and a second portion of the multilayer redistribution structure 18 directly underneath the thinned MEMS die 14 may suffer more molding pressure than the other portions of the precursor package 60.

In one embodiment, the second mold compound 22 is formed of thermoplastics or thermoset materials with a thermal conductivity greater than 2 W/m·K. A typical molding pressure (compression molding) used for applying the second mold compound 20 is between 250 psi and 1000 psi. Herein, the first device layer 24 of the thinned glass-based die 12 may have a thickness between 70 µm and 1000 µm to endure at least 750 psi molding pressure. As such, even if a first portion of the air gap 46 is vertically below the thinned glass-based die 12, and there is no extra mechanical support within the first portion of the air gap 46, vertical deformations of the thinned glass-based die 12 may not occur or may be within an acceptable level. Similarly, the second device layer 28 of the thinned MEMS die 14 has a thickness between 70 µm and 1000 µm to endure at least 750 psi molding pressure. As such, even if a second portion of the air gap 46 is vertically below the thinned MEMS die 14, and there is no extra mechanical support within the second portion of the air gap 46, vertical deformations of the thinned MEMS die 14 may not occur or may be within an acceptable level.

Since both the thinned glass-based die 12 and the thinned MEMS die 14 are low heat-generation dies, the second mold compound 22 directly residing over the thinned glass-based die 12 and the thinned MEMS die 14 is not required to have a high thermal conductivity. In another embodiment, the second mold compound 22 may be formed from an organic epoxy resin system with a thermal conductivity less than 2 W/m·K. A typical molding pressure (overmolding) used for applying the second mold compound 20 is between 100 psi and 1000 psi. Herein, the first device layer 24 of the thinned glass-based die 12 may have a thickness between 5 µm and 1000 µm, which endures at least 100 psi molding pressure. As such, even if the first portion of the air gap 46 is vertically below the thinned glass-based die 12, and there is no extra mechanical support within the first portion of the air gap 46, the vertical deformations of the thinned glass-based die 12 may not occur or may be within an acceptable level. Similarly, the second device layer 28 of the thinned MEMS die 14 may have a thickness between 5 µm and 1000 µm, which endures at least 100 psi molding pressure. As such, even if the second portion of the air gap 46 is vertically below the thinned MEMS die 14, and there is no extra mechanical support within the second portion of the air gap 46, the vertical deformations of the thinned MEMS die 14 may not occur or may be within an acceptable level.

Notice that, the silicon substrate 34 of the CMOS controller die 16 remains in the precursor package 60 and is encapsulated by the first mold compound 20. As such, the third device layer 36 of the CMOS controller die 16 is not required to be formed from glass materials or have a relatively thick thickness to avoid vertical deformation. The third device layer 36 may be formed from a combination of dielectric and metal layers (such as silicon oxide, silicon nitride, aluminum, titanium, copper, or the like) and has a thickness between 0.1 µm and 50 µm.

Figure 13:
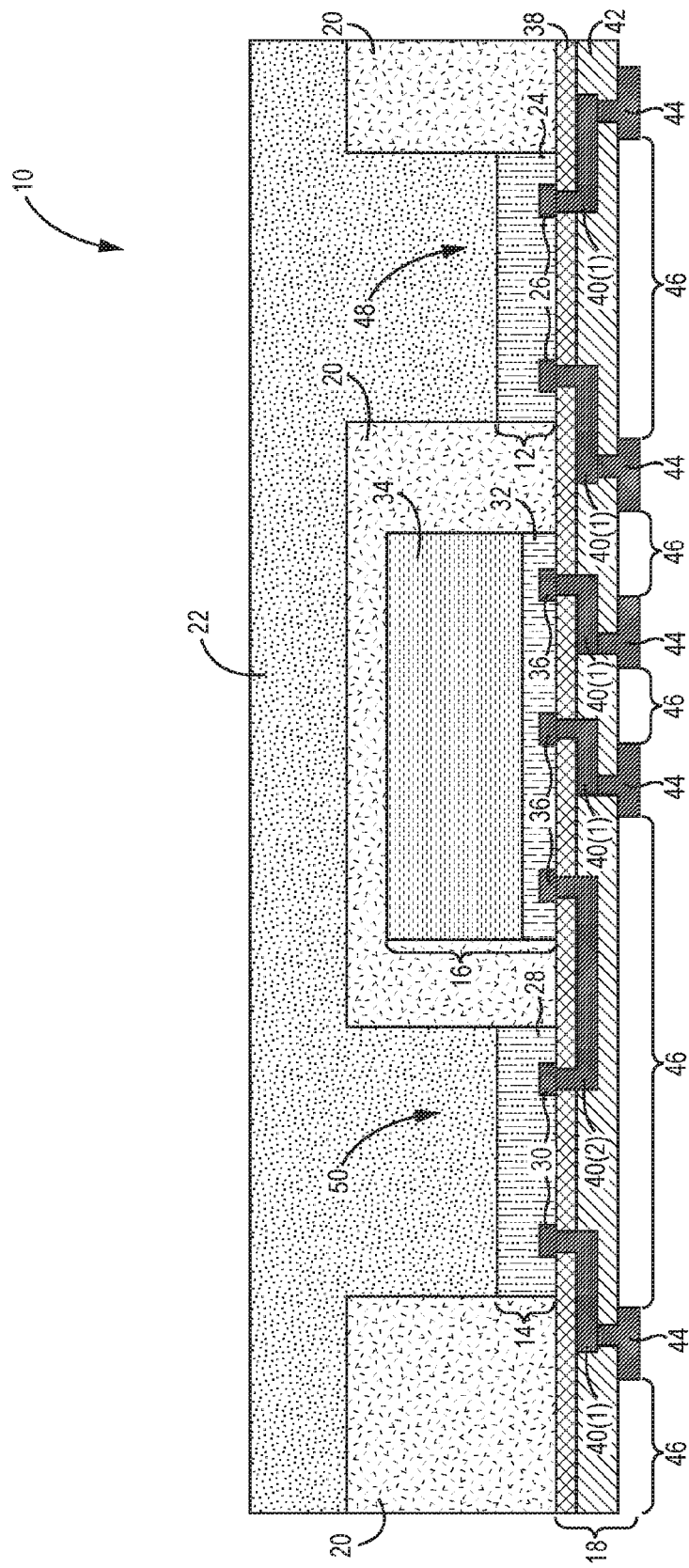

A curing process (not shown) is followed to harden the second mold compound 22. The curing temperature is between 100° C. and 320° C. depending on which material is used as the second mold compound 22. Lastly, a top surface of the second mold compound 22 is then planarized to form the wafer-level package 10, as illustrated in FIG. 13. If the second mold compound 22 does not cover a top surface of the first mold compound 20, the top surface of the second mold compound 22 and/or the first mold compound 20 are planarized to be coplanar (not shown). A mechanical grinding process may be used for planarization. The wafer-level package 10 may be marked, diced, and singulated into individual components (not shown).

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a first thinned die comprising a first device layer, which is formed from glass materials and comprises a plurality of first die contacts at a bottom surface of the first device layer;
   a second intact die comprising a second device layer and an intact silicon substrate over the second device layer, wherein the second device layer comprises a plurality of second die contacts at a bottom surface of the second device layer;
   a multilayer redistribution structure comprising a plurality of package contacts on a bottom surface of the multilayer redistribution structure and redistribution interconnects that connect the plurality of package contacts to certain ones of the plurality of first die contacts and certain ones of the plurality of second die contacts, wherein connections between the redistribution interconnects and the plurality of first die contacts, and between the redistribution interconnects and the plurality of second die contacts are solder-free;
   a first mold compound residing over the multilayer redistribution structure wherein:
       the first mold compound surrounds the first thinned die, and extends beyond a top surface of the first thinned die to define an opening within the first mold compound and over the first thinned die, wherein the top surface of the first thinned die is at a bottom of the opening; and
       the first mold compound encapsulates the second intact die; and
   a second mold compound filling the opening and in contact with the top surface of the first thinned die.

2. The apparatus of claim 1 wherein the glass materials are at least one of a group consisting of Silicon Dioxide ($SiO_2$), Aluminum Oxide ($Al_2O_3$), Lithium superoxide ($LiO_2$), Barium oxide (BaO), Potassium oxide ($K_2O$), Sodium Oxide ($Na_2O$), Boron Oxide ($B2O3$), Magnesium Oxide (MgO), Strontium Oxide (SrO), and Calcium Oxide (CaO).

3. The apparatus of claim 1 wherein the first device layer has a thickness between 5 µm and 1000 µm.

4. The apparatus of claim 1 wherein the first device layer has a thickness between 70 µm and 200 µm.

5. The apparatus of claim 1 wherein the first thinned die provides a microelectromechanical systems (MEMS) component.

6. The apparatus of claim 1 wherein the first thinned die provides a MEMS component and the second intact die provides a complementary metal-oxide-semiconductor (CMOS) controller that controls the MEMS component.

7. The apparatus of claim 1 wherein the second device layer is formed from a combination of dielectric and metal layers.

8. The apparatus of claim 1 wherein the second mold compound has an electrical resistivity greater than 1E6 Ohm-cm.

9. The apparatus of claim 1 wherein the first mold compound is formed from a same material as the second mold compound.

10. The apparatus of claim 1 wherein the first mold compound and the second mold compound are formed from different materials.

11. The apparatus of claim 1 wherein the top surface of the first thinned die exposed at the bottom of the opening is a top surface of the first device layer.

12. The apparatus of claim 1 wherein the second mold compound is formed from thermoplastics or thermoset materials with a thermal conductivity greater than 2 W/m·K.

13. The apparatus of claim 12 wherein the first device layer has a thickness between 70 µm and 1000 µm.

14. The apparatus of claim 1 wherein the second mold compound is formed from organic epoxy resin.

15. The apparatus of claim 14 wherein the first device layer has a thickness between 5 µm and 1000 µm.

16. The apparatus of claim 1, wherein the multilayer redistribution structure is glass-free.

17. A method comprising:
providing a mold wafer having a first die and a first mold compound, wherein:
the first die comprises a first device layer and a first silicon substrate over the first device layer, wherein the first device layer is formed from glass materials and comprises a plurality of first die contacts at a bottom surface of the first device layer;
a top surface of the first die is a top surface of the first silicon substrate and a bottom surface of the first die is the bottom surface of the first device layer; and
the first mold compound encapsulates sides and the top surface of the first die, wherein the bottom surface of the first device layer is exposed;
forming a multilayer redistribution structure underneath the mold wafer, wherein:
the multilayer redistribution structure comprises a plurality of package contacts on a bottom surface of the multilayer redistribution structure and redistribution interconnects that connect the plurality of package contacts to certain ones of the plurality of first die contacts; and
connections between the redistribution interconnects and the plurality of first die contacts are solder-free;
thinning down the first mold compound to expose the top surface of the first silicon substrate;
removing substantially the first silicon substrate of the first die to provide a first thinned die and form an opening within the first mold compound and over the first thinned die, wherein the first thinned die has a top surface exposed at a bottom of the opening; and
applying a second mold compound to substantially fill the opening and directly contact the top surface of the first thinned die.

18. The method of claim 17 wherein the first die provides a MEMS component.

19. The method of claim 17 wherein:
the second mold compound is formed from thermoplastics or thermoset materials with a thermal conductivity greater than 2 W/m·K;
the second mold compound is applied between 250 psi and 1000 psi; and
the first device layer has a thickness between 70 µm and 1000 µm.

20. The method of claim 17, wherein:
the second mold compound is formed from organic epoxy resin;
the second mold compound is applied between 100 psi and 1000 psi; and
the first device layer has a thickness between 5 µm and 1000 µm.

21. The method of claim 17, wherein the mold wafer further comprises a second intact die, wherein:
the second intact die has a second device layer and a second silicon substrate over the second device layer, wherein the second device layer comprises a plurality of second die contacts at a bottom surface of the second device layer; and
the first mold compound encapsulates sides and a top surface of the second intact die, wherein the bottom surface of the second device layer is exposed.

22. The method of claim 21, wherein forming the multilayer redistribution structure underneath the mold wafer further comprises connecting the plurality of package contacts to certain ones of the plurality of second die contacts by the redistribution interconnects.

23. The method of claim 22, wherein the second intact die is shorter than the first die, such that after thinning down the first mold compound to expose the top surface of the first silicon substrate, the second silicon substrate is not exposed and is still encapsulated by the first mold compound.

* * * * *